US010254552B2

(12) United States Patent
Mitra et al.

(10) Patent No.: US 10,254,552 B2
(45) Date of Patent: Apr. 9, 2019

(54) LASER ARRAY

(71) Applicant: LIMO Patentverwaltung GmbH & Co. KG, Dortmund (DE)

(72) Inventors: Thomas Mitra, Dortmund (DE); Sabine Dommers-Völkel, Dortmund (DE)

(73) Assignee: LIMO GmbH, Dortmund (DE)

(*) Notice: Subject to any disclaimer, the term of this patent is extended or adjusted under 35 U.S.C. 154(b) by 0 days.

(21) Appl. No.: 15/490,559

(22) Filed: Apr. 18, 2017

(65) Prior Publication Data
US 2017/0299876 A1  Oct. 19, 2017

(30) Foreign Application Priority Data

Apr. 19, 2016 (EP) .................................... 16166015

(51) Int. Cl.
G02B 27/12 (2006.01)
H01S 5/40 (2006.01)
(Continued)

(52) U.S. Cl.
CPC ........ *G02B 27/126* (2013.01); *B23K 26/0604* (2013.01); *B23K 26/0608* (2013.01);
(Continued)

(58) Field of Classification Search
CPC .... G02B 27/14; G02B 27/144; G02B 27/283; G02B 27/0172; G02B 27/142
(Continued)

(56) References Cited

U.S. PATENT DOCUMENTS 4,671,613 A    6/1987  Buhrer
5,212,710 A *  5/1993  Kaneda ............... G02B 6/2817
                                              359/483.01
(Continued)

FOREIGN PATENT DOCUMENTS

CN    102809823 A    12/2012
DE    10331695 A1    2/2005
(Continued)

OTHER PUBLICATIONS

Search Report in corresponding European Patent Application No. 16166015.4, completed on Oct. 19, 2016, with English translation.
(Continued)

*Primary Examiner* — Mohammed A Hasan
(74) *Attorney, Agent, or Firm* — Edell, Shapiro & Finnan, LLC

(57) ABSTRACT

A laser device comprises first and second laser units to respectively emit first and second laser beams that propagate in first and second directions and that are polarized in first and second polarization directions and a polarization coupling prism arranged to couple the two laser beams. The coupling prism comprises: a light entry surface to receive the first laser beam; a reflecting surface to reflect the first laser beam at an angle greater than the limit angle of total inner reflection; and a light exit surface through which the first laser beam exits the prism. The second laser unit is arranged relative to the polarization coupling prism to cause the second laser beam to impinge on and be reflected at the light exit surface in the same direction as the first laser beam exiting the prism, resulting in a collinear superposition of the first and second laser beams.

15 Claims, 1 Drawing Sheet

(51) Int. Cl.
  *G02B 27/28* (2006.01)
  *G02B 1/11* (2015.01)
  *G02B 27/14* (2006.01)
  *B23K 26/06* (2014.01)
  *G02B 27/09* (2006.01)
  *G02B 27/10* (2006.01)

(52) U.S. Cl.
  CPC ............ *B23K 26/0652* (2013.01); *G02B 1/11* (2013.01); *G02B 27/0905* (2013.01); *G02B 27/0972* (2013.01); *G02B 27/10* (2013.01); *G02B 27/144* (2013.01); *G02B 27/283* (2013.01); *H01S 5/4012* (2013.01); *H01S 5/4087* (2013.01); *G02B 27/1006* (2013.01)

(58) Field of Classification Search
  USPC ....................................................... 359/629
  See application file for complete search history.

(56) References Cited

U.S. PATENT DOCUMENTS

| | | | | |
|---|---|---|---|---|
| 6,584,060 B1 * | 6/2003 | Oohchida | ............ | G02B 5/1814 369/112.03 |
| 2003/0210632 A1 | 11/2003 | Shimozawa et al. | | |
| 2010/0118276 A1 | 5/2010 | Li | | |
| 2015/0015952 A1 | 1/2015 | Wolak | | |

FOREIGN PATENT DOCUMENTS

| | | |
|---|---|---|
| EP | 1178346 A2 | 2/2002 |
| JP | 58-108504 A | 6/1983 |
| JP | 62-113103 A | 5/1987 |
| JP | 64-55401 A | 3/1989 |
| JP | 4-278912 A | 10/1992 |
| JP | 8-184930 A | 7/1996 |
| JP | 2002-49019 A | 2/2002 |
| JP | 2002-250893 | 9/2002 |
| JP | 2006-48044 A | 2/2006 |
| JP | 2008-203467 A | 9/2008 |

OTHER PUBLICATIONS

Office Action in corresponding Japanese Patent Application No. 2017-083240, dated May 8, 2018, with English translation.

* cited by examiner

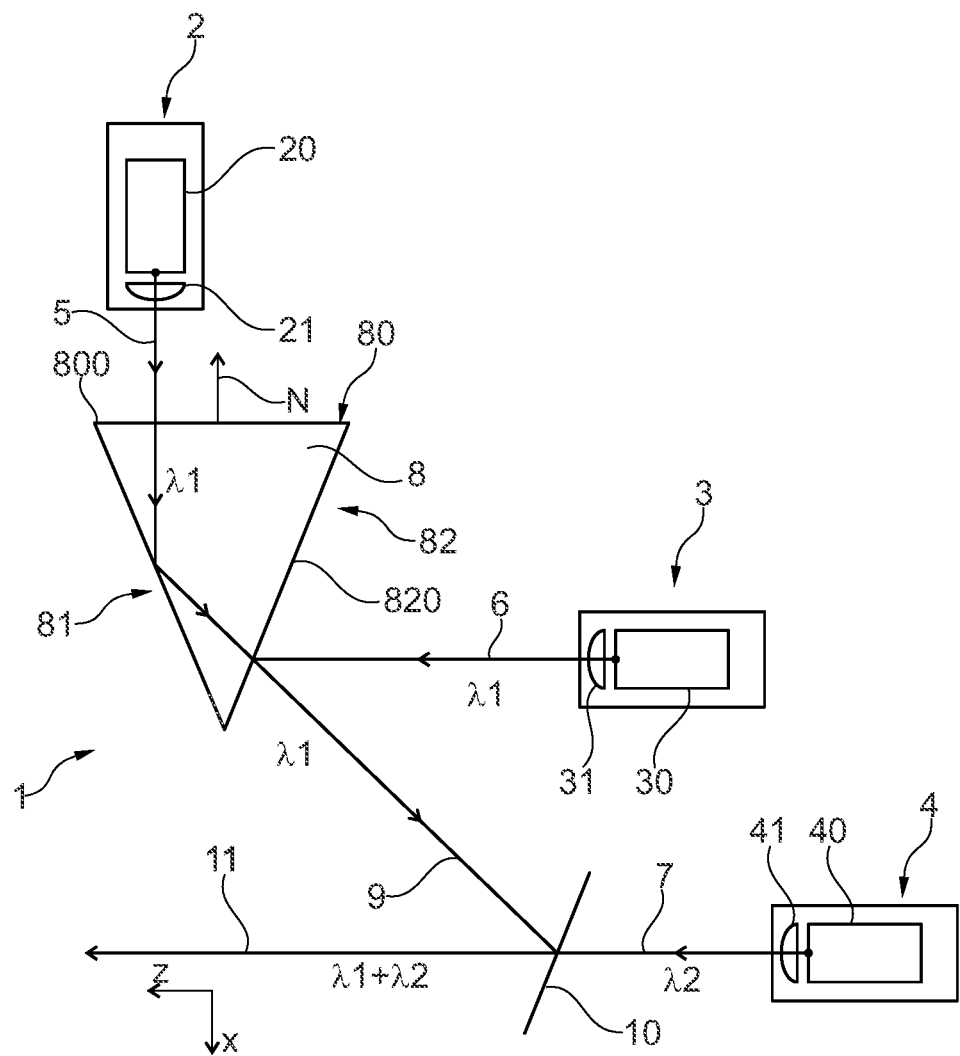

LASER ARRAY

CROSS REFERENCE TO RELATED APPLICATIONS

This application claims foreign priority under 35 U.S.C. § 119(a)-(d) to Application No. EP 16166015.4 filed on Apr. 19, 2016, the entire contents of which are hereby incorporated by reference.

TECHNICAL FIELD

The present description relates to a laser device.

BACKGROUND

Laser devices are known from the prior art in various embodiments and have, for example, semiconductor laser elements in the form of laser diode bars or stacks of laser diode bars, which are also often referred to as "stacks." In laser devices of the aforementioned type the light, which is emitted by the individual laser diode bars or, more specifically, the stacks of laser diode bars and which is linearly polarized in different ways, can be combined with the aid of a polarization coupler to form a resulting laser beam and then can be focused with suitable optics, for example, directly on a workpiece to be machined or can be introduced into a light conducting fiber.

During the polarization coupling process, at least two different linearly polarized, in particular, mutually perpendicularly polarized, laser beams, which propagate in two different, in particular, mutually orthogonal, spatial directions, are coupled with the aid of a polarization coupler and, as a result, are overlaid collinearly to form a resulting laser beam. Such polarization couplers are often designed as mirrors having a dielectric coating, which has ideally, for example, a degree of reflection $R_s$=100% for a direction of polarization that is perpendicular to the plane of incidence and has ideally a degree of reflection $R_p$=0% for a direction of polarization that is parallel to the plane of incidence.

SUMMARY

The object of the described system is to provide a laser device that enables a polarization coupling of at least two different linearly polarized laser beams in an alternative way.

Another object is to provide a generic laser device that enables a wavelength coupling of two laser beams in an alternative way.

The present description relates to a laser device, comprising a first laser unit, which during operation can emit a laser beam, which propagates in a first direction; at least a second laser unit, which during operation can emit a laser beam, which propagates in a second direction, which is different from the first direction and is oriented preferably orthogonal to the first direction; as well as a polarization coupler, which is arranged and designed such that it can couple the laser beam of the first laser unit, the laser beam being polarized in a first direction, with the laser beam of the second laser unit, the laser beam being polarized in a second direction, such that a first resulting laser beam can be obtained by a collinear superposition of the two laser beams.

BRIEF DESCRIPTION OF THE DRAWINGS

Other features and advantages of the described laser device will become apparent from the following description of a preferred exemplary embodiment with reference to the accompanying FIG. 1, which shows an optical beam path of a laser device.

DETAILED DESCRIPTION

The described laser device is characterized in that the polarization coupler is designed as a polarization coupling prism, which comprises a light entry surface, through which the laser beam of the first laser unit can enter into the polarization coupling prism; a reflecting surface, which is arranged relative to the light entry surface such that the laser beam of the first laser unit impinges on the reflecting surface at an angle that is greater than a limit angle of the total inner reflection; and a light exit surface, through which the laser beam of the first laser unit can exit out of the polarization coupling prism after the total inner reflection at the reflecting surface and can be refracted at the surface; and wherein the second laser unit is arranged relative to the polarization coupling prism such that the laser beam of the second laser unit can impinge on the light exit surface such that it can be reflected at this surface in a direction that corresponds to the direction of propagation of the laser beam of the first laser unit, the laser beam being refracted at the light exit surface, so that the first resulting laser beam can be obtained by the collinear superposition of the two laser beams. The described laser device enables in an alternative way a polarization coupling of the at least two different linearly polarized laser beams, by which a first resulting laser beam can be obtained while simultaneously retaining the quality of the beam having a power level that is more or less equal to the sum of the power levels of the polarized laser beam of the first laser unit and of the polarized laser beam of the second laser unit.

In order to avoid or, more specifically, to at least minimize any reflection losses when the laser beam of the first laser unit impinges on the light entry surface, it is proposed in one advantageous embodiment that the light entry surface of the polarization coupling prism have an antireflection coating. In this case, it may be preferably a dielectric antireflection coating.

In one particularly advantageous embodiment, it can be provided that the light exit surface of the polarization coupling prism has a dielectric coating, which has a degree of reflection $R_p$=0% and a degree of transmission $T_p$=100% for the laser beam of the first laser unit, the laser beam being polarized in the first direction. This measure makes it possible to avoid in an advantageous way the reflection losses when the laser beam of the first laser unit, the laser beam being totally reflected at the reflecting surface, impinges on the light exit surface.

In one advantageous embodiment there is the possibility that the dielectric coating has a degree of reflection $R_s$=100% and a degree of transmission $T_s$=0% for the laser beam of the second laser unit, the laser beam being polarized in the second direction. This feature also makes it possible to avoid in an advantageous way the transmission losses when the laser beam of the second laser unit impinges on the light exit surface.

Preferably, the polarization coupling prism can be arranged relative to the first laser unit such that the laser beam of the first laser unit is oriented parallel to a surface normal and impinges on the light entry surface. Owing to this perpendicular incidence of the polarized laser beam of the first laser unit on the light entry surface, a high degree of transmission is achieved for the beam path of this polarized laser beam of the first laser unit.

In a preferred embodiment, the laser beam of the first laser unit is polarized in a direction parallel to a plane of incidence, in which this laser beam impinges on the polarization coupling prism. Preferably the laser beam of the second laser unit can be polarized in a direction perpendicular to a plane of incidence, in which this laser beam impinges on the polarization coupling prism. Hence, the two laser beams can be polarized, in particular, orthogonal to each other.

In one advantageous embodiment there is the possibility that the laser beam of the first laser unit has a central wavelength $\lambda 1$, which is identical to a central wavelength $\lambda 1$ of the laser beam of the second laser unit.

In a particularly advantageous further development it is proposed that the laser device comprise at least a third laser unit, which during operation can emit a laser beam, and a wavelength coupler, which is arranged in the beam path of the laser device such that it can overlay the polarization coupled, first resulting laser beam collinearly with the laser beam of the third laser unit, so that a second resulting laser beam can be obtained. This wavelength coupling makes it possible to boost the power of the laser device even further.

Preferably the wavelength coupler can be designed as a mirror, which has a multilayer, dielectric coating. This feature makes it possible to achieve an efficient wavelength coupling.

In a preferred embodiment it is proposed that the wavelength coupler, in particular, the mirror be disposed in the beam path of the laser device such that upon impinging on the wavelength coupler, the first resulting laser beam and the laser beam of the third laser unit enclose an angle >90° with each other.

In an advantageous embodiment it is proposed that the laser beam of the third laser unit have a central wavelength $\lambda 2$, which is different from the central wavelength $\lambda 1$ of the laser beams of the first laser unit and the second laser unit.

In a preferred embodiment it can be provided that the dielectric coating of the mirror is designed such that it has for the angle of incidence, at which the laser beam, emitted from the third laser unit, impinges on the mirror, a degree of transmission $T_{\lambda,2}=100\%$ and a degree of reflection $R_{\lambda,2}=0\%$ for the laser beam. Owing to this measure, it is possible to achieve a maximum transmission of the laser beam emitted from the third laser unit.

In a particularly preferred embodiment there is the possibility that the dielectric coating of the mirror is designed such that it has a degree of reflection $R_{\lambda,1}=100\%$ and a degree of transmission $T_{\lambda,1}=0\%$ for the angle of incidence, at which the polarization coupled, first resulting laser beam impinges on the mirror. In this way, the transmission losses can be prevented in an advantageous way.

The laser device, which is presented herein and in which the polarization coupled, first resulting laser beam with the central wavelength $\lambda 1$ and the laser beam of the third laser unit with the central wavelength $\lambda 2$ enclose preferably an angle >90° with each other when impinging on the wavelength coupler, makes possible, in particular, a simpler design of the wavelength coupler, which is designed preferably as a mirror and which has a dielectric coating that can comprise significantly fewer layers than is the case with conventional wavelength coupler. As a result, the costs for the production of the wavelength coupler can be reduced. Furthermore, the absorption effects can be decreased in an advantageous way. If the number of layers of the dielectric coating of the mirror cannot be reduced in comparison to the conventional mirrors that are used as the wavelength coupler, then the first resulting laser beam, obtained by polarization coupling, can be coupled with the laser beam of the third laser unit, where in this case the difference in wavelength $\Delta\lambda, =\lambda 2-\lambda 1$ can be less than in the prior art. Thus, the coupling of closer wavelengths $\lambda 1$, $\lambda 2$ is possible in an advantageous way.

According to another aspect, the present description relates to a laser device, comprising a first laser unit, which during operation can emit a laser beam, which is polarized in a first direction of polarization and which has a central wavelength, which propagates in a first direction; at least a second laser unit, which during operation can emit a laser beam, which is polarized in the first direction of polarization and which has a central wavelength, which is different from the central wavelength of the laser beam of the first laser unit and which propagates in a second direction, which is different from the first direction and is oriented preferably orthogonal to the first direction; as well as a wavelength coupler, which is arranged and designed such that it can couple the laser beam of the first laser unit with the laser beam of the second laser unit such that a first resulting laser beam can be obtained by a collinear superposition of the two laser beams.

In order to couple the wavelengths of laser beams, it is customary to use wavelength coupler, which are designed as mirrors with a dielectric coating, in the prior art.

An additional laser device described herein is characterized in that the wavelength coupler is designed as a wavelength coupling prism, which comprises a light entry surface, through which the laser beam of the first laser unit can enter into the wavelength coupling prism; a reflecting surface, which is arranged relative to the light entry surface such that the laser beam of the first laser unit impinges on the reflecting surface at an angle that is greater than a limit angle of the total inner reflection; and a light exit surface, through which the laser beam of the first laser unit can exit out of the wavelength coupling prism after the total inner reflection at the reflecting surface and can be refracted at the surface; and wherein the second laser unit is arranged relative to the wavelength coupling prism such that the laser beam of the second laser unit can impinge on the light exit surface such that it can be reflected at this surface in a direction that corresponds to the direction of propagation of the laser beam of the first laser unit, the laser beam being refracted at the light exit surface, so that the first resulting laser beam can be obtained by the collinear superposition of the two laser beams.

The inventive laser device enables in an alternative way a wavelength coupling of the at least two identically polarized laser beams, by which a first resulting laser beam can be obtained while simultaneously retaining the quality of the beam having a power level that is more or less equal to the sum of the power levels of the laser beam of the first laser unit and of the laser beam of the second laser unit. Therefore, a prism can be used for the polarization coupling of two laser beams and for the wavelength coupling of two laser beams.

In one advantageous further development, it is proposed that the laser device comprise at least a third laser unit, which during operation can emit a laser beam, which is polarized in a second direction of polarization, which is different from the first direction of polarization; and a polarization coupler, which is arranged in the beam path of the laser device such that it can overlay the first resulting laser beam collinearly with the laser beam of the third laser unit, so that a second resulting laser beam can be obtained, wherein the polarization coupler is designed preferably as a mirror, which has a multilayer, dielectric coating. The mirror with the dielectric coating is used in this case for polarization coupling. Preferably, the two directions of polarization are oriented orthogonal to each other. Owing to the polarization coupling, the power of the laser device can be further increased. In order to avoid or, more specifically, to at least minimize any reflection losses when the laser beam of the first laser unit impinges on the light entry surface of the wavelength coupling prism, in one advantageous embodiment the light entry surface has an antireflection coating. In this case, it may be preferably a dielectric antireflection coating.

In one particularly advantageous embodiment it can be provided that the light exit surface of the wavelength coupling prism has a dielectric coating, which has a degree of reflection $R_{\lambda,1}=0\%$ and a degree of transmission $T_{\lambda,1}=100\%$ for the laser beam of the first laser unit. This measure makes it possible to avoid in an advantageous way the reflection losses when the laser beam of the first laser unit, the laser beam being totally reflected at the reflecting surface, impinges on the light exit surface.

In one advantageous embodiment there is the possibility that the dielectric coating of the laser exit surface has a degree of reflection $R_{\lambda,2}=100\%$ and a degree of transmission $T_{\lambda,2}=0\%$ for the laser beam of the second laser unit. This feature also makes it possible to avoid in an advantageous way the transmission losses when the laser beam of the second laser unit impinges on the light exit surface.

Preferably, the wavelength coupling prism can be arranged relative to the first laser unit such that the laser beam of the first laser unit is oriented parallel to a surface normal and impinges on the light entry surface. Owing to this perpendicular incidence of the laser beam of the first laser unit on the light entry surface, a high degree of transmission is achieved for the beam path of this laser beam of the first laser unit.

In a preferred embodiment, the polarization coupler, in particular, the mirror is disposed in the beam path of the laser device such that upon impinging on the polarization coupler, the first resulting laser beam and the laser beam of the third laser unit enclose an angle >90° with each other.

In a preferred embodiment, it can be provided that the dielectric coating of the mirror is designed such that it has for the angle of incidence, at which the (polarized) laser beam, emitted from the third laser unit, impinges on the mirror, a degree of transmission T=100% and a degree of reflection R=0% for the laser beam. Owing to this measure, it is possible to achieve a maximum transmission of the laser beam, emitted from the third laser unit.

In a particularly preferred embodiment there is the possibility that the dielectric coating of the mirror is designed such that it has a degree of reflection R=100% and a degree of transmission T=0% for the angle of incidence, at which the polarized, wavelength coupled, first resulting laser beam impinges on the mirror. In this way, the transmission losses can be prevented in an advantageous way.

FIG. 1 shows an optical beam path of a laser device 1. Furthermore, FIG. 1 shows, in addition, a Cartesian coordinate system, which symbolizes a first spatial direction (X direction) and a second spatial direction (Z direction), which extends orthogonal to the first spatial direction.

In this exemplary embodiment the laser device 1 comprises in total three laser units 2, 3, 4, each of which comprises a semiconductor laser element 20, 30, 40 and, associated therewith, optical elements 21, 31, 41. The semiconductor laser elements 20, 30, 40 can be designed preferably as laser diode bars or as stacks of laser diode bars (so-called "stacks"). The optical elements 21, 31, 41, which are arranged downstream of the semiconductor laser elements 20, 30, 40 in the direction of propagation of the laser beams 5, 6, 7, emitted from the semiconductor laser elements 20, 30, 40, are shown in a simplified, merely schematic form as lenses in FIG. 1. The optical elements 21, 31, 41 can comprise, in particular, a fast axis collimating lens, one or more slow axis collimating lenses as well as other beam shaping mechanisms. In this case, the fast axis collimating lenses are used to at least partially collimate the laser beams 5, 6, 7, which are emitted from the semiconductor laser elements 20, 30, 40, in the so-called fast axis direction, in which they have a larger beam divergence than in a direction, which extends perpendicularly to the fast axis direction and which is also called the slow axis direction. Correspondingly the slow axis collimating lenses are used to at least partially collimate the laser beams 5, 6, 7, which are emitted from the semiconductor laser elements 20, 30, 40, in the slow axis direction. The additional beam shaping mechanisms of the optical elements 21, 31, 41 of the laser units 2, 3, 4 can be, for example, homogenizers or also lens combinations for combining individual partial beams of the resulting laser beams 5, 6, 7, emitted from the semiconductor laser elements 20, 30, 40. Therefore, each one of the laser units 2, 3, 4 can be constructed such that a relatively well collimated, in particular, homogeneous and well focusable laser beam 5, 6, 7 can leave the laser units.

Furthermore, the laser device 1, shown in FIG. 1, comprises a polarization coupler, which is designed as a polarization coupling prism 8. This polarization coupling prism 8 is disposed in the beam path of the laser device 1 in such a way and is designed so that it can couple the laser beam 5 of a first laser unit 2 of the laser device 1, the laser beam being polarized in a direction parallel to a plane of incidence, in which the laser beam 5 impinges on the polarization coupling prism 8, with a laser beam 6 of a second laser unit 3, which is polarized in a direction perpendicular to the plane of incidence, such that a first resulting laser beam 9 can be obtained by a collinear superposition of these two laser beams 5, 6 while simultaneously retaining the beam quality. In this case, the laser beam 5 of the first laser unit 2 and the laser beam 6 of the second laser unit 3 have the same central wavelength λ1.

In the present case, the polarization coupling prism 8 is a straight prism, which has a base surface in the form of an isosceles triangle. The polarization coupling prism 8 has a light entry surface 80, through which the laser beam 5, which is polarized (p polarized) parallel to the plane of incidence and which is emitted from the first laser unit 2, can enter, oriented parallel to a surface normal N, into the polarization coupling prism 8 in the X direction. Furthermore, the polarization coupling prism 8 has a reflecting surface 81 that encloses with the light entry surface 80 an angle, which is selected such that the p-polarized laser beam 5, which propagates in the X direction and which is emitted from the first laser unit 2, impinges on the reflecting surface 81 at an angle that is greater than the limit angle of the total inner reflection. In this way the p-polarized laser beam 5 of the first laser unit 2 is subject to a total inner reflection at the reflecting surface 81 without any reflection losses. Owing to the perpendicular incidence of the p-polarized laser beam 5 of the first laser unit 2 on the light entry surface 80, a high degree of transmission is achieved for the beam path of the p-polarized laser beam 2 of the first laser unit 5. In order to avoid or, more specifically, at least minimize, in addition, any potential reflection losses at the light entry surface 80, it is advantageous in this context that the light entry surface 80 have, as provided in this exemplary embodiment, an antireflection coating 800.

Furthermore, the polarization coupling prism 8 comprises a light exit surface 82, which has a dielectric coating 820, which has a degree of reflection $R_p$=0% and a degree of transmission $T_p$=100% for the light that is polarized parallel to the plane of incidence and a degree of reflection $R_s$=100% and a degree of transmission $T_s$=0% for the light that is polarized perpendicular to the plane of incidence. Owing to this measure, it is achieved that the p-polarized laser beam 2, which is totally reflected at the reflecting surface 81 of the polarization coupling prism 8 and which is emitted from the first laser unit 5, is not reflected at the light exit surface 82, but rather is subject to a maximum transmission and, in so doing, is refracted.

The second laser unit 6 is disposed such that the s-polarized laser beam 2, emitted from the laser unit, propagates in the Z direction and impinges at a position on the light exit surface 82, where it is subject, owing to the degree of reflection $R_s$=100%, to a total reflection and where the p-polarized laser beam 5 of the first laser unit 2 in turn emerges from the light exit surface 82 and, in so doing, is refracted. In this case the angle of reflection of the s-polarized laser beam 6 at the light exit surface 82 is equal to the angle of refraction of the p-polarized laser beam 5 at the light exit surface 82. In this way the p-polarized laser beam 5 of the first laser unit 2 and the s-polarized laser beam 6 of the second laser unit 3 are overlaid collinearly to form a first resulting laser beam 9 having the central wavelength λ1. This polarization coupling allows the p-polarized laser beam 5 of the first laser unit 2 and the s-polarized laser beam 6 of the second laser unit 3 to be combined to form the first resulting laser beam 9 without changing the parameters of the beam, which has a power level that is equivalent to the sum of the power levels of the p-polarized laser beam 5 and the s-polarized laser beam 6.

The laser beam 7, which is emitted from the third laser unit 4, has a central wavelength λ2, which is different from the (identical) central wavelengths λ1 of the p-polarized laser beam 5 of the first laser unit 2 and the s-polarized laser beam 6 of the second laser unit 3. As can be seen in FIG. 1, the laser beam 7, emitted from the third laser unit 4, propagates in the Z direction parallel to the s-polarized laser beam 6 of the second laser unit 3 prior to its reflection at the light exit surface 82 of the polarization coupling prism 8.

Furthermore, the laser device 1 has a wavelength coupler, which is configured to couple the first resulting laser beam 9, obtained by polarization coupling, with the laser beam 7, emitted from the third laser unit 4, and to combine collinearly into a second resulting laser beam 11, which in the present case propagates in the Z direction. In the present case the wavelength coupler, by which the power of the laser device 1 can be further increased, is designed as a mirror 10, which has a multilayer, dielectric coating. As can be seen in FIG. 1, the mirror 10 is configured so as to be inclined with respect to the Z direction, which forms not only the direction of propagation of the laser beam 7, emitted from the third laser unit 4, but also the direction of propagation of the second resulting laser beam 11. The multilayer, dielectric coating of the mirror 10 is designed such that it has a degree of transmission $T_{\lambda 2}$=100% and a degree of reflection $R_{\lambda 2}$=0% for the angle of incidence of the laser beam 7, emitted from the third laser unit 4. The angle of incidence of the first resulting laser beam 9 on the mirror 10 is selected such that the first resulting laser beam 9 can be reflected from the mirror 10 in the direction of the direction of propagation of the laser beam 7, which is emitted from the third laser unit 4 and which in the present case is the Z direction. As a result, the laser beam 7, emitted from the third laser unit 4, and the first resulting laser beam 9, reflected at the wavelength coupler 10, are overlaid collinearly to form the second resulting laser beam 11, which propagates in the Z direction. The multilayer, dielectric coating of the mirror 10 is designed such that it has a degree of reflection $R_{\lambda 1}$=100% and a degree of transmission $T_{\lambda 1}$=0% for the angle of incidence, at which the first resulting laser beam 9 impinges on the mirror 10.

The optical beam path of the laser device 1 enables an efficient polarization and wavelength coupling of the laser beams 5, 6, 7, emitted from the three laser units 2, 3, 4, so that there is no need to deflect the beam by 90° for the polarization coupling, as is the case with conventional polarization coupler. At the same time the design is maintained that the p-polarized laser beam 5 of the first laser unit 2 and the s-polarized laser beam 6 of the second laser unit 3 propagate orthogonal to each other prior to impinging on the polarization coupling prism 8. As a result, the adjustment of the first laser unit 2 and the second laser unit 3 in the beam path of the laser device 1 can be simplified. It is just as advantageous that the laser light 7 of the third laser unit 4 propagates parallel to the laser beam 6 of the second laser unit 3 before it impinges on the polarization coupling prism 8.

The laser device 1 that is presented herein enables, in particular, a simpler design of the wavelength coupler, which is designed as a mirror 10 and which has a dielectric coating that can comprise significantly fewer layers than is the case with conventional wavelength coupler. This feature can reduce the costs for the production of the mirror 10. Furthermore, the absorption effects can be decreased in an advantageous way.

If the number of layers of the dielectric coating of the mirror 10 is not reduced in comparison to the conventional mirrors, which are used as wavelength coupler, then the first resulting laser beam 9, which is obtained by polarization coupling, can be coupled with the laser beam 7 of the third laser unit 4, where in this case the wavelength difference Δλ=λ2−λ1 can be less than in the case of the prior art. Hence, the coupling of closer wavelengths λ1, λ2 is possible in an advantageous way.

In principle, the design, shown in FIG. 1, also allows a wavelength coupling with the aid of the polarization coupling prism 8, which then acts as the wavelength coupling prism. Then the laser beam 5, which is emitted from the first laser unit 2, has a central wavelength λ1, which is different from the central wavelength λ2 of the laser beam 6, emitted from the second laser unit 3. Both laser beams 5, 6 of the first laser unit 2 and of the second laser unit 3 are polarized in a first (common) direction. The first resulting laser beam 9 in turn is obtained by the wavelength coupling. The third laser unit 4 emits a laser beam 7, which is polarized in a second direction of polarization, which is different from the first direction of polarization; in particular, the second direction of polarization is orthogonal to the first direction of polarization. In contrast to the first design variant, the mirror 10 in this variant does not form a wavelength coupler, but rather a polarization coupler. The second resulting laser beam 11 is obtained by the polarization coupling of the first resulting beam 9 with the laser beam 7, emitted from the third laser unit 4. The dielectric coating 820 of the light exit surface 82 of the wavelength coupling prism has a degree of reflection $R_{\lambda 1}$=0% and a degree of transmission $T_{\lambda 1}$=100% preferably for the first central wavelength λ1 and a degree of reflection $R_{\lambda 2}$=100% and a degree of transmission $T_{\lambda 2}$=0% for the second central wavelength λ2. The dielectric coating of the mirror 10 is designed such that it can reflect the first resulting laser beam 9, which is polarized in the first direction of polarization, and can transmit the laser beam 7, which is polarized in the second direction of polarization and which is emitted from the third laser unit 4, so that a polarization coupling can be obtained.

What is claimed is:

1. A laser device comprising:
    a first laser unit to emit a first laser beam that propagates in a first direction and that is polarized in a first polarization direction;
    a second laser unit to emit a second laser beam that propagates in a second direction oriented orthogonal to the first direction and that is polarized in a second polarization direction; and
    a polarization coupling prism arranged to couple the first and second laser beams, the polarization coupling prism comprising:
        a light entry surface to receive the first laser beam into the polarization coupling prism;
        a reflecting surface to reflect the first laser beam, the reflecting surface being arranged relative to the light entry surface to cause the first laser beam to impinge on the reflecting surface at an angle that is greater than a limit angle of total inner reflection; and
        a light exit surface arranged to allow the first laser beam to exit out of the polarization coupling prism along an exit beam path after the total inner reflection at the reflecting surface, the first laser beam being refracted at the light exit surface,
    wherein the second laser unit is arranged relative to the polarization coupling prism to cause the second laser beam to impinge on and be reflected at the light exit surface in a direction that corresponds to the direction at which the first laser beam exists the light exit surface, the first and second polarization directions being oriented such that a first resulting laser beam results from collinear superposition of the first and second laser beams.

2. The laser device of claim 1, wherein the light entry surface of the polarization coupling prism includes an anti-reflection coating.

3. The laser device of claim 1, wherein the light exit surface of the polarization coupling prism includes a dielectric coating having a degree of reflection $R_p=0\%$ and a degree of transmission $T_p=100\%$ for the first laser beam.

4. The laser device of claim 3, wherein the dielectric coating has a degree of reflection $R_s=100\%$ and a degree of transmission $T_s=0\%$ for the second laser beam.

5. The laser device of claim 1, wherein the polarization coupling prism is arranged relative to the first laser unit such that the first laser beam is oriented parallel to a surface normal and impinges on the light entry surface.

6. The laser device of claim 1, wherein the first polarization direction is parallel to a plane of incidence in which the first laser beam impinges on the polarization coupling prism.

7. The laser device of claim 1, wherein second polarization direction is perpendicular to a plane of incidence in which the second laser beam impinges on the polarization coupling prism.

8. The laser device of claim 1, wherein the first laser beam has a same central wavelength as the second laser beam.

9. The laser device of claim 1, further comprising:
    a third laser unit to emit a third laser beam; and
    a wavelength coupler arranged in the exit beam path from the polarization coupling prism to overlay the first resulting laser beam collinearly with the third laser beam to generate a second resulting laser beam, the wavelength coupler comprising a mirror with a multi-layer, dielectric coating.

10. The laser device of claim 9, wherein the wavelength coupler is disposed in the exit beam path from the polarization coupling prism such that, upon impinging on the wavelength coupler, the first resulting laser beam and the third laser beam enclose an angle greater than 90° with each other.

11. The laser device of claim 9, wherein the third laser beam has a central wavelength that is different from a central wavelength of the first and second laser beams.

12. The laser device of claim 9, wherein, for the angle of incidence at which the third laser beam impinges on the mirror, the dielectric coating has a degree of transmission $T_{\lambda,2}=100\%$ and a degree of reflection $R_{\lambda,2}=0\%$ for the third laser beam.

13. The laser device of claim 9, wherein for the angle of incidence at which the first resulting laser beam impinges on the mirror, the dielectric coating has a degree of reflection $R_{\lambda,1}=100\%$ and a degree of transmission $T_{\lambda,1}=0\%$.

14. A laser device comprising:
    a first laser unit to emit a first laser beam that propagates in a first direction and that is polarized in a first polarization direction and has a first central wavelength;
    a second laser unit to emit a second laser beam that propagates in a second direction oriented orthogonal to the first direction and that is polarized in the first polarization direction and has a second central wavelength that is different from the first central wavelength; and
    a wavelength coupling prism arranged to couple the first and second laser beams, the polarization coupling prism comprising:
    a light entry surface to receive the first laser beam into the polarization coupling prism;
        a reflecting surface to reflect the first laser beam, the reflecting surface being arranged relative to the light entry surface to cause the first laser beam to impinge on the reflecting surface at an angle that is greater than a limit angle of total inner reflection; and
        a light exit surface arranged to allow the first laser beam to exit out of the polarization coupling prism along an exit beam path after the total inner reflection at the reflecting surface, the first laser beam being refracted at the light exit surface,
    wherein the second laser unit is arranged relative to the polarization coupling prism to cause the second laser beam to impinge on and be reflected at the light exit surface in a direction that corresponds to the direction at which the first laser beam exists the light exit surface such that a first resulting laser beam results from collinear superposition of the first and second laser beams.

15. The laser device of claim 14, further comprising:
    a third laser unit to emit a third laser beam that is polarized in a second polarization direction that is different from the first polarization direction; and
    a polarization coupler arranged in the exit beam path from the wavelength coupling prism to overlay the first resulting laser beam collinearly with the third laser beam to generate a second resulting laser beam, the polarization coupler comprising a mirror with a multi-layer, dielectric coating.

* * * * *